US012744076B2

(12) United States Patent
Em

(10) Patent No.: US 12,744,076 B2
(45) Date of Patent: Sep. 22, 2026

(54) MAIN WORD LINE DRIVER AND MEMORY APPARATUS USING THE SAME

(71) Applicant: SK hynix Inc., Icheon-si (KR)

(72) Inventor: Ho Seok Em, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 237 days.

(21) Appl. No.: 18/499,027

(22) Filed: Oct. 31, 2023

(65) Prior Publication Data

US 2025/0006247 A1 Jan. 2, 2025

(30) Foreign Application Priority Data

Jun. 27, 2023 (KR) ........................ 10-2023-0082742

(51) Int. Cl.
*G11C 8/08* (2006.01)
*G11C 11/4074* (2006.01)
*G11C 11/408* (2006.01)

(52) U.S. Cl.
CPC ...... *G11C 11/4085* (2013.01); *G11C 11/4074* (2013.01); *G11C 11/4087* (2013.01)

(58) Field of Classification Search
CPC ............ G11C 11/4085; G11C 11/4074; G11C 11/4093
See application file for complete search history.

(56) References Cited

U.S. PATENT DOCUMENTS 10,593,392 B1 * 3/2020 Johnson .................. G11C 8/10
10,978,138 B2 4/2021 Kim et al.
11,302,381 B1 * 4/2022 Kim .................... G11C 11/4087
2013/0155801 A1 * 6/2013 Yun .......................... G11C 8/08 365/230.06
2019/0019544 A1 * 1/2019 Derner ................ G11C 11/2259
2020/0349990 A1 * 11/2020 Ingalls ................ G11C 11/4085
2020/0349998 A1 * 11/2020 Kim ......................... G11C 8/08
2021/0265259 A1 * 8/2021 Niki ................... G11C 13/0004
2022/0084578 A1 * 3/2022 Li ....................... G11C 11/4093
2023/0017400 A1 * 1/2023 Wang ............... H03K 19/01721
2023/0223069 A1 * 7/2023 Schreck ................... G11C 8/08 365/149

FOREIGN PATENT DOCUMENTS

KR 1020210110012 A 9/2021

* cited by examiner

*Primary Examiner* — Mushfique Siddique
(74) *Attorney, Agent, or Firm* — WILLIAM PARK AND ASSOCIATES LTD.

(57) ABSTRACT

A memory apparatus includes a first main word line signal, a second main word line signal, and a word line driver. The first main word line signal is coupled to a first sub-word line driver block including n sub-word line drivers. The second main word line signal is coupled to a second sub-word line driver block including n sub-word line drivers. The main word line driver is configured to selectively enable one of the first and second main word line signals.

16 Claims, 5 Drawing Sheets

Figure 1:
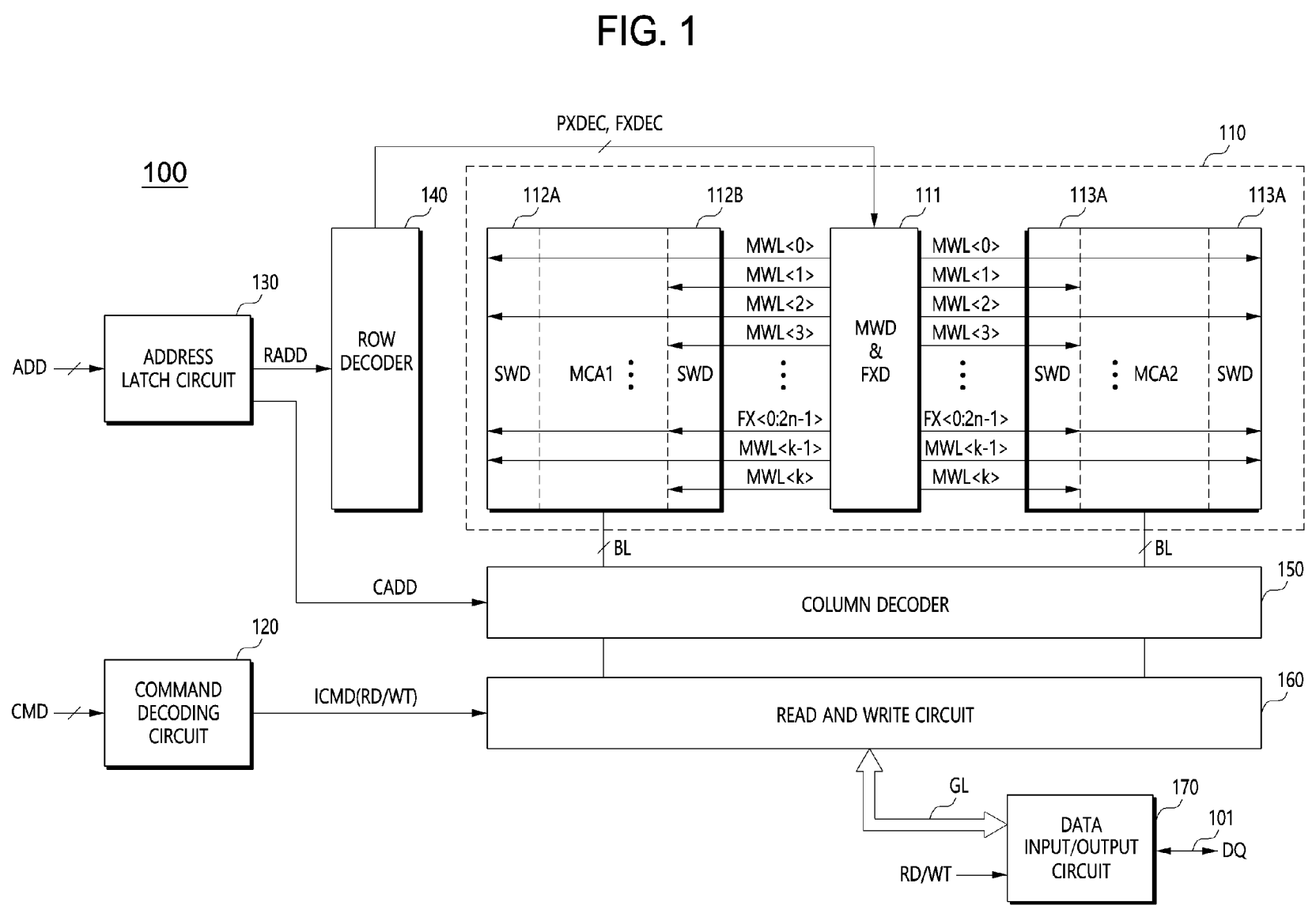

ADD

ADDRESS LATCH CIRCUIT

130

RADD

ROW DECODER

140

PXDEC, FXDEC

CADD

CMD

COMMAND DECODING CIRCUIT

120

ICMD(RD/WT)

110

112A

112B

SWD

MCA1

BL

MWL<0>

MWL<1>

MWL<2>

MWL<3>

FX<0:2n-1>

MWL<k-1>

MWL<k>

111

MWD & FXD

113A

MCA2

150

COLUMN DECODER

160

READ AND WRITE CIRCUIT

GL

RD/WT

170

DATA INPUT/OUTPUT CIRCUIT

101

DQ 200
222B
220
222A
MCA
221_n
221_n-1
221_n-2
221_2
221_1
223B
224
223A
230
212B
210
212A
MCA
211_n
211_n-1
211_n-2
211_2
211_1
213B
214
213A
x
y
z 300
310
312A
312B
311_n
311_n-1
311_n-2
311_2
311_1
WL<0>
WL<1>
WL<2>
WL<3>
BL
BLSA
SWDA
SWDB
FX<0:n>
FX<n:2n-1>
MWL<0>
MWL<1>
MWL<2>
MWL<3>
320
MWD
MWD1
MWD2
PXDEC
FXDEC (EOSEL)

MAIN WORD LINE DRIVER AND MEMORY APPARATUS USING THE SAME

CROSS-REFERENCES TO RELATED APPLICATION

The present application claims priority under 35 U.S.C. § 119(a) to Korean Patent Application No. 10-2023-0082742, filed on Jun. 27, 2023, in the Korean Intellectual Property Office, which is incorporated herein by reference in its entirety.

BACKGROUND

1. Technical Field

The present technology relates to an integrated circuit technology, and particularly, to a main word line driver and a memory apparatus using the same.

2. Related Art

An electronic device includes many electronic components, and a computer system may include many electronic components composed of a semiconductor. The semiconductor devices that constitute the computer system may include a processor or memory controller that operates as a master device and a memory apparatus or storage device that operates as a slave device. The master device may provide a command address signal to the slave device. The slave device may perform various operations based on the command address signal. Furthermore, the master device and the slave device may mutually transmit and receive data.

As the data communication speed and the data processing capacity are increased, a memory apparatus having a high data storage capacity is required. In a conventional technology, the data storage capacity of the memory apparatus has been increased through a shrink technology and process optimization, but the increase of the data storage capacity through only a two-dimensional (2-D) design has reached its limit. Accordingly, a three-dimensional (3-D) memory apparatus capable of supporting a maximum data storage capacity in the same area by stacking a plurality of memory cell arrays is being developed.

SUMMARY

In an embodiment, a main word line driver may include an enable control signal generation circuit, a first driver, and a second driver. The enable control signal generation circuit may be configured to generate an enable control signal based on a pre-decoding signal. The first driver may be configured to enable a first main word line signal based on the enable control signal and an even selection signal. The second driver may be configured to enable a second main word line signal based on the enable control signal and an odd selection signal.

In an embodiment, a memory apparatus may include a plurality of memory cell arrays, a sub-word line driver block, a main word line driver block. Each of the plurality of memory cell arrays may include a plurality of word lines and sequentially stacked. The sub-word line driver block may be configured to enable the plurality of word lines of any one of the plurality of memory cell arrays based on a first main word line signal, a second main word line signal, and a sub-word line selection signal. The main word line driver block may be configured to enable the first and second main word line signals based on a pre-decoding signal and an even and odd selection signal.

In an embodiment, a memory apparatus may include a first main word line signal, a second main word line signal, and a first main word line driver. The first main word line signal may be coupled to a first sub-word line driver block including n sub-word line drivers. The second main word line signal may be coupled to a second sub-word line driver block including n sub-word line drivers. The first main word line driver may be configured to enable one of the first and second main word line signals based on a first bit of a pre-decoding signal and an even and odd selection signal.

BRIEF DESCRIPTION OF THE DRAWINGS

FIG. 1 is a diagram illustrating a configuration of a memory apparatus according to an embodiment.

DETAILED DESCRIPTION

Figure 2:
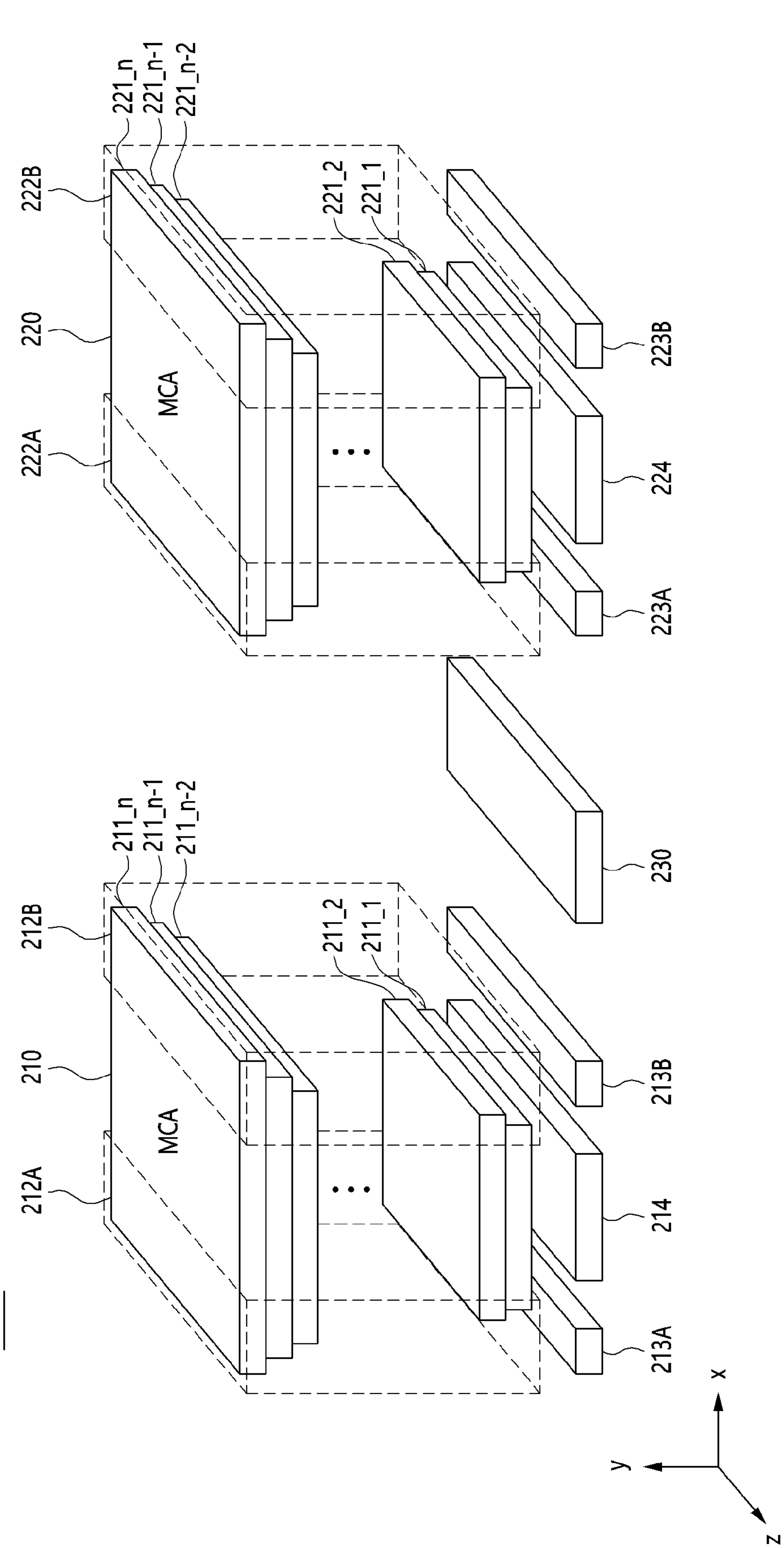
FIG. 2 is a perspective view illustrating a configuration of a storage area according to an embodiment.

FIG. 1 is a diagram illustrating a configuration of a memory apparatus 100 according to an embodiment. Referring to FIG. 1, the memory apparatus 100 may include a storage area 110, a command decoding circuit 120, an address latch circuit 130, a row decoder 140, a column decoder 150, a read and write circuit 160, and a data input/output circuit 170. The storage area 110 may include a plurality of memory cell array blocks. The plurality of memory cell array blocks may include a plurality of memory cells capable of storing data. For example, the storage area 110 may include a first memory cell array block MCA1 and a second memory cell array block MCA2. FIG. 1 exemplifies that the number of memory cell array blocks that are included in the storage area 110 is 2. However, the number of memory cell array blocks that are included in the storage area 110 may be 4, 8, or more. The first and second memory cell array blocks MCA1 and MCA2 may each include a plurality of word lines (not illustrated) and a plurality of bit lines BL. The plurality of memory cells may be coupled to points at which the plurality of word lines and the plurality of bit lines BL intersect. The first and second memory cell array blocks MCA1 and MCA2 may each include a plurality of memory cell arrays. The plurality of memory cell arrays may be stacked as a plurality of layers to form the first and second memory cell array blocks MCA1 and MCA2. A space between the first and second memory cell array blocks MCA1 and MCA2 may be a row hole area 111. A main word line driver block MWD and a sub-word line selection driver block FXD may be disposed in the row hole area 111. Both sides of the first memory cell array block MCA1 may be slim areas 112A and 112B. Sub-word line driver blocks SWD may be disposed under the slim areas 112A and 112B, respectively. Both sides of the second memory cell array block MCA2 may be slim areas 113A and 113B. Sub-word line driver blocks SWD may be disposed under the slim areas 113A and 113B, respectively. The main word line driver block MWD may generate a plurality of main word line signals MWL<0:k> (k is an integer equal to or greater than 5). For example, the main word line driver block MWD may receive a pre-decoding signal PXDEC, and may enable at least one of the plurality of main word line signals MWL<0:k> based on the pre-decoding signal PXDEC. The number of bits that are included in the pre-decoding signal PXDEC may be half the number of bits that are included in the main word line signal. The main word line driver block MWD may enable two main word line signals by using one bit of the pre-decoding signal PXDEC. For example, the main word line driver block MWD may enable (k+1) main word line signals by using the pre-decoding signal PXDEC having ((k+1)/2) bits. The main word line block MWD enables the (k+1) main word line signals by using the pre-decoding signal PXDEC having ((k+1)/2) bits. Accordingly, the number of bits that are included in the pre-decoding signal PXDEC and the number of wires through which the pre-decoding signal PXDEC is transmitted can be reduced. The main word line signals MWL<0:k> may be coupled to the sub-word line driver blocks SWD. The sub-word line selection driver block FXD may generate sub-word line selection signals FX<0:2n−1> (n is an integer equal to or greater than 5) based on a selection decoding signal FXDEC, and may provide the sub-word line selection signals FX<0:2n−1> to the sub-word line driver block SWD. The sub-word line driver block SWD may enable a word line of the first and second memory cell array blocks MCA1 and MCA2 based on the main word line signals MWL<0:k> and the sub-word line selection signals FX<0:2n−1>.

FIG. 2 is a perspective view illustrating a configuration of a storage area 200 according to an embodiment. The storage area 200 may be applied as the storage area 110 illustrated in FIG. 1. Referring to FIG. 2, the storage area 200 may include a first memory cell array (MCA) block 210 and a second memory cell array (MCA) block 220. The first memory cell array block 210 may include n memory cell arrays 211_1 to 211_*n*. The n memory cell arrays 211_1 to 211_*n* may be sequentially stacked. For example, a first memory cell array 211_1 may be disposed at the bottom of the first memory cell array block 210. Second to n-th memory cell arrays 211_2 to 211_*n* may be sequentially stacked on the first memory cell array 211_1. The first to n-th memory cell arrays 211_1 to 211_*n* may include a plurality of word lines that extend in a horizontal direction (i.e., an x axis direction). Both sides of the first memory cell array block 210 may each be formed in a step form. The both sides each having the step form may be slim areas 212A and 212B. The first to n-th memory cell arrays 211_1 to 211_*n* may have exposed parts, respectively, in the slim areas 212A and 212B. The n-th memory cell array 211_*n* may have the largest area. An (n−1)-th memory cell array 211_*n*−1 may have a smaller area than the n the memory cell array 211_*n*. The first memory cell array 211_1 may have the smallest area. In an embodiment, the n memory cell arrays may become progressively wider, as illustrated, from the first memory cell array 211_1 to the n-th memory cell array 211_*n*. The first to n-th memory cell arrays 211_1 to 211_*n* may form layers of the first memory cell array block 210, respectively. A structure having the step form, which is formed in each of the slim areas 212A and 212B, may be provided to independently enable the word lines of the first to n-th memory cell arrays 211_1 to 211_*n*. Sub-word line driver blocks 213A and 213B may be disposed under the slim areas 212A and 212B, respectively. The first to n-th memory cell arrays 211_1 to 211_*n* may be coupled to the sub-word line driver blocks 213A and 213B in the slim areas 212A and 212B. The sub-word line driver blocks 213A and 213B may be coupled to the exposed parts of the first to n-th memory cell arrays 211_1 to 211_*n* in the slim areas 212A and 212B, and may enable the word lines of the first to n-th memory cell arrays 211_1 to 211_*n*.

A plurality of memory cells may be formed in a middle part of the first memory cell array block 210 except the slim areas 212A and 212B. The plurality of memory cells of the first to n-th memory cell arrays 211_1 to 211_*n* may be coupled to a sense amplification block 214 through a bit line (not illustrated) that is formed in the middle part in a vertical direction (i.e., a y axis direction). The sense amplification block 214 may be disposed under the first memory cell array 211_1. The sense amplification block 214 may be disposed under the middle part of the first memory cell array block 210, and may be disposed between the sub-word line driver blocks 213A and 213B. A row hole area 230 may be disposed between the first memory cell array block 210 and the second memory cell array block 220. A main word line driver block and a sub-word line selection driver block may be disposed in the row hole area 230. That is, the main word line driver block and the sub-word line selection driver block may be disposed in a plane different from a plane in which the first and second memory cell array blocks 210 and 220 are disposed.

The second memory cell array block 220 may include n memory cell arrays 221_1 to 221_*n*. The n memory cell arrays 221_1 to 221_*n* may be sequentially stacked. For example, a first memory cell array 221_1 may be disposed at the bottom of the second memory cell array block 220. Second to n-th memory cell arrays 221_2 to 221_*n* may be sequentially stacked on the second memory cell array 221_1. The first to n-th memory cell arrays 221_1 to 221_*n* may include a plurality of word lines that extend in the horizontal direction (i.e., the x axis direction). Both sides of the second memory cell array block 220 may each be formed in a step form. The both sides each having the step form may be slim areas 222A and 222B. The first to n-th memory cell arrays 221_1 to 221_*n* may have exposed parts, respectively, in the slim areas 222A and 222B. The n-th memory cell array 221_*n* may have the largest area. The (n−1)-th memory cell array 221_*n*−1 may have a smaller area than the n the memory cell array 221_*n*. The first memory cell array 221_1 may have the smallest area. In an embodiment, the n memory cell arrays may become progressively wider, as illustrated, from the first memory cell array 221_1 to the n-th memory cell array 221_*n*. The first to n-th memory cell arrays 221_1 to 221_*n* may form the layers of the second memory cell array block 220, respectively. Sub-word line driver blocks 223A and 223B may be disposed under the slim areas 222A and 222B. The first to n-th memory cell arrays 221_1 to 221_*n* may be coupled to the sub-word line driver blocks 223A and 223B in the slim areas 222A and 222B. The sub-word line driver blocks 223A and 223B may be coupled to the exposed parts of the first to n-th memory cell arrays 221_1 to 221_*n* in the slim areas 222A and 222B, and may enable the word lines of the first to n-th memory cell arrays 221_1 to 221_*n*.

A plurality of memory cells may be formed in a middle part of the second memory cell array block 220 except the slim areas 222A and 222B. The plurality of memory cells of the first to n-th memory cell arrays 221_1 to 221_*n* may be coupled to a sense amplification block 224 through a bit line (not illustrated) that is formed in the middle part in the vertical direction (i.e., the y axis direction). The sense amplification block 224 may be disposed under the first memory cell array 221_1. The sense amplification block 224 may be disposed under the middle part of the second memory cell array block 220, and may be disposed between the sub-word line driver blocks 223A and 223B. In an embodiment, the main word line driver block may be disposed under the memory cell array block 210 and 220 not the row hole area 230. The main word line driver block may be disposed under the middle part of each of the first and second memory cell array blocks 210 and 220 along the sense amplification blocks 214 and 224.

Referring back to FIG. 1, the command decoding circuit 120 may receive a command signal CMD, and may generate an internal command signal ICMD by decoding the command signal CMD. The internal command signal ICMD may include a read signal RD and a write signal WT. The command signal CMD may be a signal that is provided by a host device (not illustrated) that is coupled to the memory apparatus 100. The host device may provide the command signal CMD to the memory apparatus 100 so that the memory apparatus 100 can perform various operations. An operation of outputting, to the host device, data stored in the memory apparatus 100 may be a read operation. An operation of storing, in the memory apparatus 100, data received from the host device may be a write operation. When the host device provides the command signal CMD for enabling the memory apparatus 100 to perform a read operation, the command decoding circuit 120 may generate the read signal RD by decoding the command signal CMD. When the host device provides the command signal CMD for enabling the memory apparatus 100 to perform a write operation, the command decoding circuit 120 may generate the write signal WT by decoding the command signal CMD. The command decoding circuit 120 may provide the internal command signal ICMD to the read and write circuit 160 and the data input/output circuit 170.

The address latch circuit 130 may receive an address signal ADD, and may generate a row address signal RADD and a column address signal CADD based on the address signal ADD. The address signal ADD may be a signal that is provided from the host device to the memory apparatus 100. The host device may provide the address signal ADD to the memory apparatus 100 to access the first and second memory cell array blocks MCA1 and MCA2 of the memory apparatus 100. The address latch circuit 130 may latch the address signal ADD, and may output the latched address signal as the row address signal RADD or the column address signal CADD. For example, the address latch circuit 130 may output, as the row address signal RADD, the address signal ADD that is received during an active operation of the memory apparatus 100. The active operation may be an operation of activating the first and second memory cell array blocks MCA1 and MCA2 before a read operation and a write operation are performed. The memory apparatus 100 may enable a word line of the first and second memory cell array blocks MCA1 and MCA2 based on the row address signal RADD during the active operation. The address latch circuit 130 may output, as the column address signal CADD, the address signal ADD that is received during one of a read operation and write operation of the memory apparatus 100. The memory apparatus 100 may select a bit line BL of the first and second memory cell array blocks MCA1 and MCA2 based on the column address signal CADD during the read and write operations. When a specific word line, among the word lines of the first and second memory cell array blocks MCA1 and MCA2, is enabled and a specific bit line, among the bit lines BL of the first and second memory cell array blocks MCA1 and MCA, is selected, a memory cell that has been coupled between the enabled word line and the selected bit line may be accessed.

The row decoder 140 may receive the row address signal RADD. The row decoder 140 may generate the pre-decoding signal PXDEC and the selection decoding signal FXDEC by decoding the row address signal RADD. The row decoder 140 may provide the pre-decoding signal PXDEC and the selection decoding signal FXDEC to the main word line driver block MWD and the sub-word line selection driver block FXD. The column decoder 150 may receive the column address signal CADD. The column decoder 150 may select a specific bit line, among the bit lines BL of the first and second memory cell array blocks MCA1 and MCA2, based on the column address signal CADD. The column decoder 150 may couple the selected bit line to the read and write circuit 160.

The read and write circuit 160 may be coupled to the bit line BL through the column decoder 150. The read and write circuit 160 may receive the read signal RD and the write signal WT from the command decoding circuit 120. The read and write circuit 160 may be coupled to the data input/output circuit 170 through a global data line GL. The read and write circuit 160 may amplify data that are output through the bit line BL from the first and second memory cell array blocks MCA1 and MCA2 based on the read signal RD during a read operation of the memory apparatus 100, and may output the data through the global data line GL. The read and write circuit 160 may receive data that are transmitted through the global data line GL based on the write signal WT during a write operation of the memory apparatus 100, and may provide the received data to the bit line BL by amplifying the received data. The data that are received through the bit line BL may be stored in the first and second memory cell array blocks MCA1 and MCA2.

The data input/output circuit 170 may be coupled to the global data line GL and a data bus 101. The data bus 101 may be a signal transmission line that couples the host device and the memory apparatus 100. The data input/output circuit 170 may receive the read signal RD and the write signal WT from the command decoding circuit 120. The data input/output circuit 170 may receive data that are transmitted through the global data line GL based on the read signal RD during a read operation of the memory apparatus 100, may generate a data stream DQ based on the received data, and may transmit the data stream DQ to the host device through the data bus 101. The data input/output circuit 170 may receive the data stream DQ that is transmitted by the host device through the data bus 101 based on the write signal WT during a write operation of the memory apparatus 100, and may transmit data that are generated from the data stream DQ to the read and write circuit 160 through the global data line GL.

Figure 3:
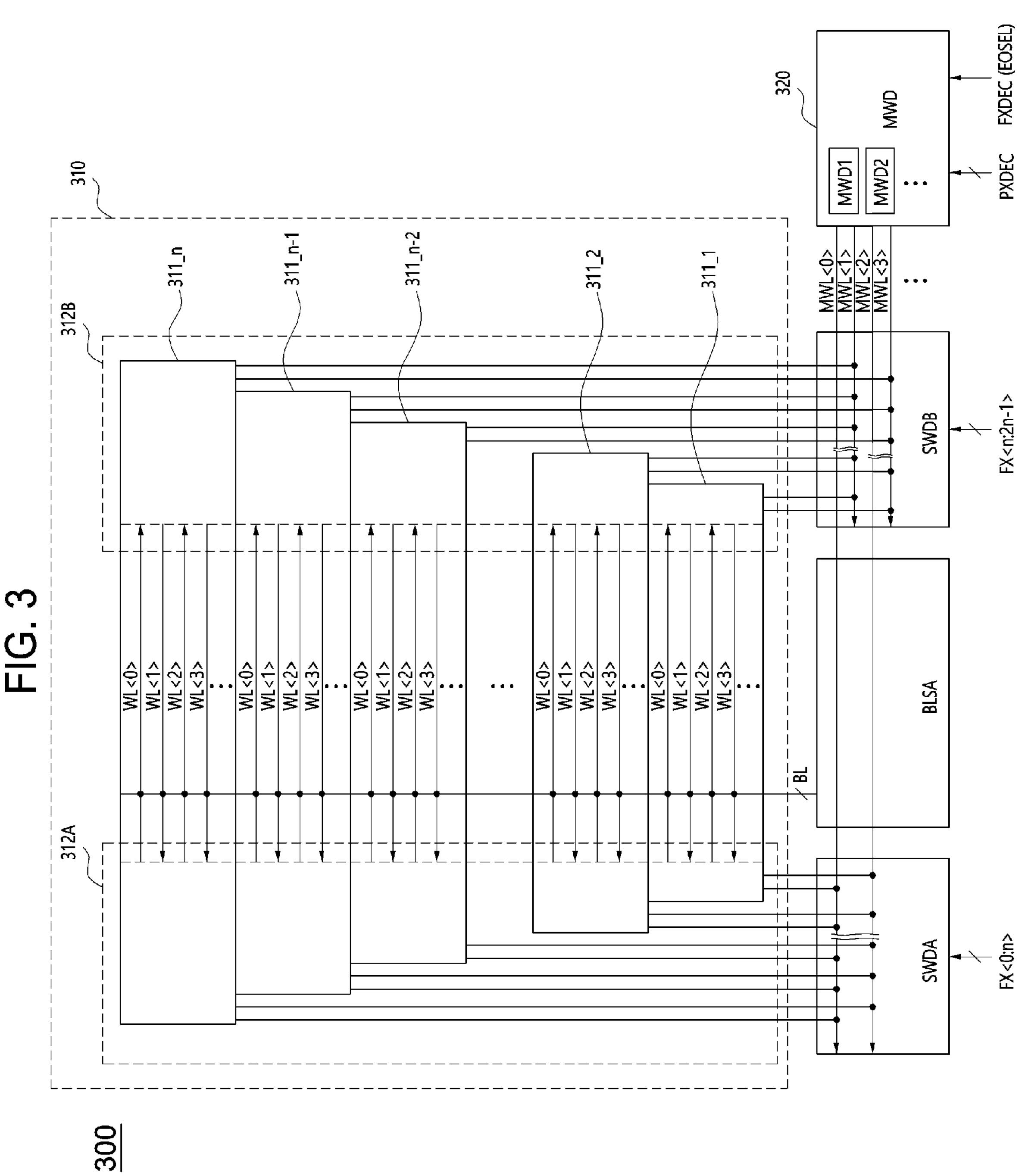
FIG. 3 is a vertical cross-sectional view illustrating a configuration of a storage area according to an embodiment.

FIG. 3 is a vertical cross-sectional view illustrating a configuration of a storage area 300 according to an embodiment. The storage area 300 may be applied as the storage area 110 illustrated in FIG. 1. For a clear description, FIG. 3 may illustrate a configuration of one memory cell array block 310. Referring to FIG. 3, the storage area 300 may include the memory cell array block 310. The memory cell array block 310 may include n memory cell arrays 311_1 to 311_*n*. A first memory cell array 311_1 may be disposed at the bottom of the memory cell array block 310. Second to n-th memory cell arrays 311_2 to 311_*n* may be sequentially stacked on the first memory cell array 311_1. Both sides of the memory cell array block 310 may be slim areas 312A and 312B. The slim areas 312A and 312B may each have a step form. The first to n-th memory cell arrays 311_1 to 311_*n* may each protrude to the outside by the same area in the slim areas 312A and 312B. The first to n-th memory cell arrays 311_1 to 311_*n* may each include a plurality of word lines in a middle part of the memory cell array block 310 except the slim areas 312A and 312B.

Sub-word line driver blocks SWDA and SWDB may be disposed under the slim areas 312A and 312B, respectively. A first sub-word line driver block SWDA may be disposed under the slim area 312A, and a second sub-word line driver block SWDB may be disposed under the slim area 312B. The sub-word line driver blocks SWDA and SWDB may each include sub-word line drivers the number of which corresponds to the product of the number of memory cell arrays that are included in the memory cell array block 310 and the number of main word line signals. The sub-word line driver block SWDA may be coupled to the first to n-th memory cell arrays 311_1 to 311_n through respective exposed parts of the first to n-th memory cell arrays 311_1 to 311_n in the slim area 312A. The sub-word line driver block SWDB may be coupled to the first to n-th memory cell arrays 311_1 to 311_n through respective exposed parts of the first to n-th memory cell arrays 311_1 to 311_n in the slim area 312B. A sense amplification block BLSA may be disposed between the sub-word line driver blocks SWDA and SWDB. The sense amplification block BLSA may be disposed under a middle part of the memory cell array block 310. The first to n-th memory cell arrays 311_1 to 311_n may be coupled to the sense amplification block BLSA through a bit line BL. The sense amplification block BLSA may include bit line sense amplifiers the number of which corresponds to the number of bit lines BL. The side of the memory cell array block 310 and the sub-word line driver block SWDB may be a row hole area 320. A main word line driver block MWD may be disposed in the row hole area 320. Although not illustrated, the sub-word line selection driver block FXD illustrated in FIG. 1 may also be disposed in the row hole area 320.

The main word line driver block MWD may generate a plurality of main word line signals MWL<0>, MWL<1>, MWL<2>, MWL<3>, . . . . For example, the main word line driver block MWD may generate first to fourth main word line signals MWL<0>, MWL<1>, MWL<2>, and MWL<3>. The first main word line signal MWL<0> may be coupled to the sub-word line driver block SWDA. The first main word line signal MWL<0> may be coupled to n sub-word line drivers in the sub-word line driver block SWDA. The second main word line signal MWL<1> may be coupled to the sub-word line driver block SWDB. The second main word line signal MWL<1> may be coupled to n sub-word line drivers in the sub-word line driver block SWDB. The third main word line signal MWL<2> may be coupled to the sub-word line driver block SWDA. The third main word line signal MWL<2> may be coupled to n sub-word line drivers in the sub-word line driver block SWDA. The fourth main word line signal MWL<3> may be coupled to the sub-word line driver block SWDB. The fourth main word line signal MWL<3> may be coupled to n sub-word line drivers in the sub-word line driver block SWDB.

In the sub-word line driver block SWDA, the n sub-word line drivers that are coupled to the first main word line signal MWL<0> may be coupled to the first to n-th memory cell arrays 311_1 to 311_n, respectively, and may enable first word lines WL<0> of the first to n-th memory cell arrays 311_1 to 311_n. The n sub-word line drivers may be selectively activated based on sub-word line selection signals FX<0:n−1>. The first word line WL<0> that is coupled to an activated sub-word line driver, among the first word lines WL<0> of the first to n-th memory cell arrays 311_1 to 311_n, may be enabled. In the sub-word line driver block SWDB, the n sub-word line drivers that are coupled to the second main word line signal MWL<1> may be coupled to the first to n-th memory cell arrays 311_1 to 311_n, respectively, and may enable the second word lines WL<1> of the first to n-th memory cell arrays 311_1 to 311_n. The n sub-word line drivers may be selectively activated based on the sub-word line selection signals FX<n:2n−1>. The second word line WL<1> that is coupled to an activated sub-word line driver, among the second word lines WL<1> of the first to n-th memory cell arrays 311_1 to 311_n, may be enabled. In the sub-word line driver block SWDA, the n sub-word line drivers that are coupled to the third main word line signal MWL<2> may be coupled to the first to n-th memory cell arrays 311_1 to 311_n, respectively, and may enable the third word lines WL<2> of the first to n-th memory cell arrays 311_1 to 311_n. The n sub-word line drivers may be selectively activated based on the sub-word line selection signals FX<0:n−1>. The third word line WL<2> that is coupled to an activated sub-word line driver, among the third word lines WL<2> of the first to n-th memory cell arrays 311_1 to 311_n, may be enabled. In the sub-word line driver block SWDB, the n sub-word line drivers that are coupled to the fourth main word line signal MWL<3> may be coupled to the first to n-th memory cell arrays 311_1 to 311_n, respectively, and may enable the fourth word lines WL<3> of the first to n-th memory cell arrays 311_1 to 311_n. The n sub-word line drivers may be selectively activated based on the sub-word line selection signals FX<n:2n−1>. The fourth word line WL<3> that is coupled to an activated sub-word line driver, among the fourth word lines WL<3> of the first to n-th memory cell arrays 311_1 to 311_n, may be enabled.

For example, if the memory cell array block 310 includes 32 memory cell arrays, the first to fourth main word line signals MWL<0>, MWL<1>, MWL<2>, and MWL<3> may each be coupled to 32 sub-word line drivers in the sub-word line driver blocks SWDA and SWDB. If the memory cell array block 310 includes 64 memory cell arrays, the first to fourth main word line signals MWL<0>, MWL<1>, MWL<2>, and MWL<3> may each be coupled to 64 sub-word line drivers in the sub-word line driver blocks SWDA and SWDB. As the number of memory cell arrays that are included in the memory cell array block 310 is increased, the number of sub-word line drivers that are coupled to one main word line signal is increased. Accordingly, a load of the main word line signal may be increased, and the time taken for the word lines of the first to n-th memory cell arrays 311_1 to 311_n to be enabled may be delayed. To constantly maintain the load of the main word line signal, the number of main word line signals needs to be increased as the number of memory cell arrays that are included in the memory cell array block 310 is increased. When the number of main word line signals is increased, a power distribution network characteristic may be deteriorated because the number of wires in the horizontal direction, which may be used to supply power, is reduced. In an embodiment of the present technology, as the number of memory cell arrays that are included in the memory cell array block 310 is increased, driving power of the main word line driver block MWD that drives a main word line signal may be increased without increasing the number of sub-word lines that are coupled to the main word line signal. However, as the number of memory cell arrays, the number of sub-word line drivers that are coupled to one main word line signal is increased. Accordingly, a load of main word line signal may be increased, and the time taken for the word lines of memory cell arrays to be enabled may be delayed.

The main word line driver block MWD may include a first main word line driver MWD1 and a second main word line driver MWD2. The first and second main word line drivers MWD1 and MWD2 may each generate two main word line signals MWL, and may each selectively enable one of the two main word line signals MWL. The first main word line driver MWD1 may selectively enable one of the first and second main word line signals MWL<0> and MWL<1> based on at least some bits of the selection decoding signal FXDEC and a first bit of the pre-decoding signal PXDEC. The at least some bits of the selection decoding signal FXDEC may be used as an even and odd selection signal EOSEL. For example, the even and odd selection signal EOSEL may be one bit of the selection decoding signal FXDEC. One bit of the selection decoding signal FXDEC and/or the even and odd selection signal EOSEL may have a first logic level to assert one of the sub-word line selection signals FX<0:n−1>, and may have a second logic level to assert one of the sub-word line selection signals FX<n:2n−1>. The first main word line driver MWD1 may enable the first main word line signal MWL<0>, when the first bit of the pre-decoding signal PXDEC for enabling at least one of the first main word line signal MWL<0> and the second main word line signal MWL<1> is asserted and the even and odd selection signal EOSEL has the first logic level. The first main word line driver MWD1 may enable the second main word line signal MWL<1>, when the first bit of the pre-decoding signal PXDEC for enabling at least one of the first main word line signal MWL<0> and the second main word line signal MWL<1> is asserted and the even and odd selection signal EOSEL has the second logic level.

The second main word line driver MWD2 may selectively enable one of the third and fourth main word line signals MWL<2> and MWL<3> based on at least some bits of the selection decoding signal FXDEC and a second bit of the pre-decoding signal PXDEC. The second main word line driver MWD2 may enable the third main word line signal MWL<2>, when the second bit of the pre-decoding signal PXDEC for enabling at least one of the third main word line signal MWL<2> and the fourth main word line signal MWL<3> is asserted and the even and odd selection signal EOSEL has the first logic level. The second main word line driver MWD2 may enable the fourth main word line signal MWL<3>, when the second bit of the pre-decoding signal PXDEC for enabling at least one of the third main word line signal MWL<2> and the fourth main word line signal MWL<3> is asserted and the even and odd selection signal EOSEL has the second logic level. The first and second main word line drivers MWD1 and MWD2 of the main word line driver block MWD may each enable two main word line signals based on one bit of the pre-decoding signal PXDEC and the even and odd selection signal EOSEL. Accordingly, the main word line driver block MWD can enable all of the main word line signals MWL<0>, MWL<1>, MWL<2>, MWL<3>, . . . based on only the pre-decoding signal PXDEC that includes the number of bits corresponding to half the number of main word line signals MWL<0>, MWL<1>, MWL<2>, MWL<3>, . . . .

Figure 4:
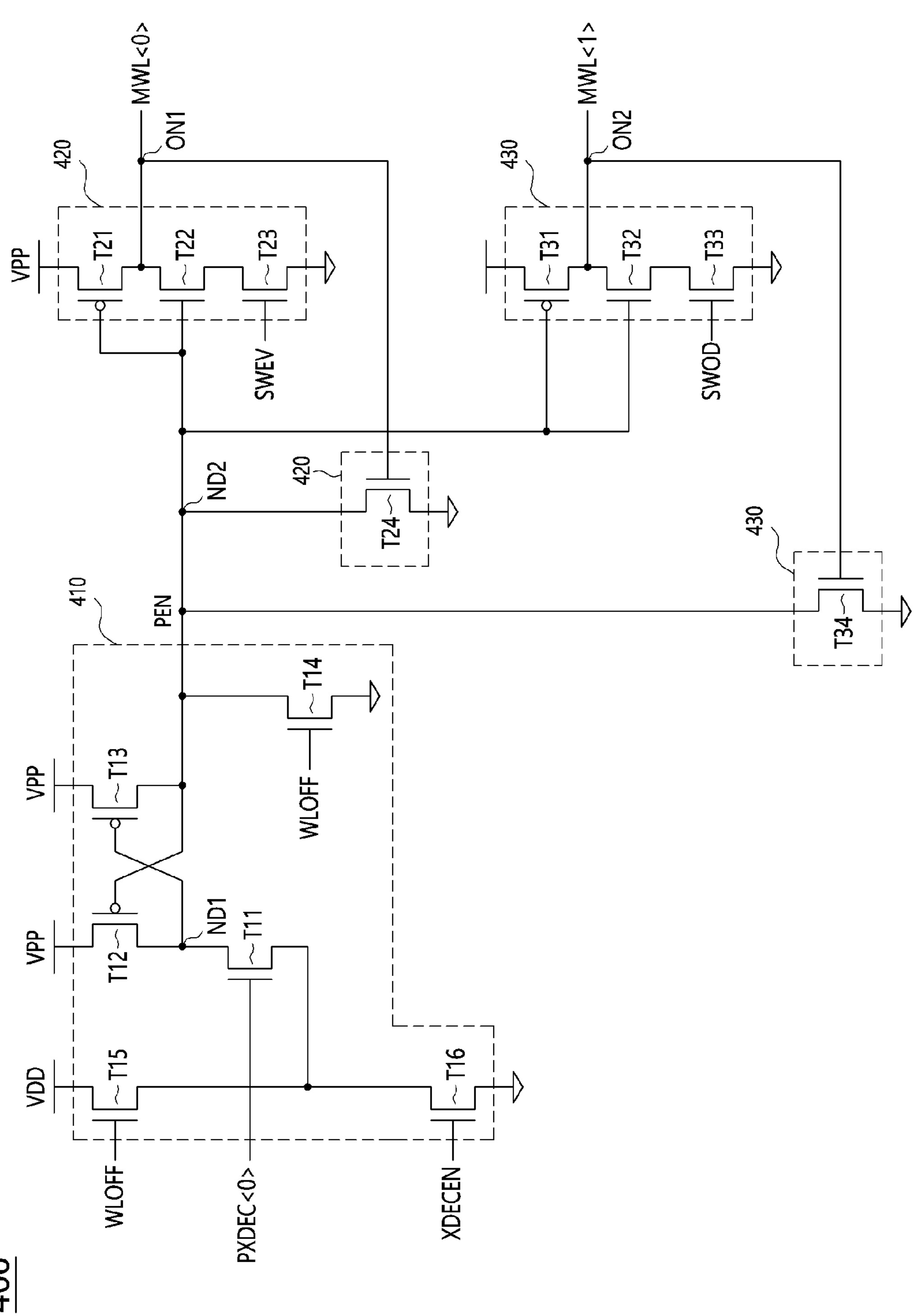
FIG. 4 is a diagram illustrating a configuration of a main word line driver according to an embodiment.

FIG. 4 is a diagram illustrating a configuration of a main word line driver 400 according to an embodiment. The main word line driver 400 may be applied as each of the first and second main word line drivers MWD1 and MWD2 illustrated in FIG. 3. Referring to FIG. 4, the main word line driver 400 may include an enable control signal generation circuit 410, a first driver 420, and a second driver 430. The enable control signal generation circuit 410 may receive a first pre-decoding signal PXDEC<0>. The enable control signal generation circuit 410 may generate an enable control signal PEN based on the first pre-decoding signal PXDEC<0>. Referring to FIG. 4 along with FIG. 3, when the main word line driver 400 is applied as the first main word line driver MWD1, the first pre-decoding signal PXDEC<0> may be the first bit of the pre-decoding signal PXDEC, and may be the pre-decoding signal PXDEC that is asserted to enable the first main word line signal MWL<0> and the second main word line signal MWL<1>.

The enable control signal generation circuit 410 may drive a first node ND1 to the voltage level of a ground voltage when the first pre-decoding signal PXDEC<0> is asserted. The enable control signal generation circuit 410 may drive the enable control signal PEN to the voltage level of a first power supply voltage VPP based on the voltage level of the first node ND1. When the first node ND1 is driven to the voltage level of the ground voltage, the enable control signal generation circuit 410 may enable the enable control signal PEN by providing the first power supply voltage VPP as the enable control signal PEN. The enable control signal generation circuit 410 may further receive a word line off signal WLOFF. The word line off signal WLOFF may be a signal that is enabled in a precharge operation of the memory apparatus 100 illustrated in FIG. 1. The memory apparatus 100 may disable a word line that has been enabled during the precharge operation. The enable control signal generation circuit 410 may disable the enable control signal PEN by driving the enable control signal PEN to the voltage level of the ground voltage based on the word line off signal WLOFF. The enable control signal generation circuit 410 may provide a second power supply voltage VDD to the first node ND1 based on the word line off signal WLOFF. When the second power supply voltage VDD is provided to the first node ND1, the enable control signal generation circuit 410 may disable the enable control signal PEN. The second power supply voltage VDD may have a lower voltage level than the first power supply voltage VPP and may have a higher voltage level than the ground voltage.

The first driver 420 may receive the enable control signal PEN and an even selection signal SWEV. The first driver 420 may enable a first main word line signal MWL<0> based on the enable control signal PEN and the even selection signal SWEV. The first driver 420 may enable the first main word line signal MWL<0> when the enable control signal PEN and the even selection signal SWEV are enabled. The first driver 420 may maintain the state in which the first main word line signal MWL<0> has been enabled when the first main word line signal MWL<0> is enabled. The second driver 430 may receive the enable control signal PEN and an odd selection signal SWOD. The second driver 430 may enable a second main word line signal MWL<1> based on the enable control signal PEN and the odd selection signal SWOD. The second driver 430 may enable the second main word line signal MWL<1> when the enable control signal PEN and the odd selection signal SWOD are enabled. The second driver 430 may maintain the state in which the second main word line signal MWL<1> has been enabled when the second main word line signal MWL<1> is enabled. The even selection signal SWEV and the odd selection signal SWOD may be generated based on the even and odd selection signal EOSEL illustrated in FIG. 3. For example, when the even and odd selection signal EOSEL has the first logic level, the even selection signal SWEV may be enabled, and the odd selection signal SWOD may be disabled. When the even and odd selection signal EOSEL has the second logic level, the even selection signal SWEV may be disabled, and the odd selection signal SWOD may be enabled.

The enable control signal generation circuit 410 may include a first transistor T11, a second transistor T12, a third transistor T13, a fourth transistor T14, and a fifth transistor T15. The first, fourth, and fifth transistors T11, T14, and T15 may each be an N channel MOS transistor. The second and third transistors T12 and T13 may each be a P channel MOS transistor. A gate of the first transistor T11 may receive the first pre-decoding signal PXDEC<0>. A drain of the first transistor T11 may be coupled to the first node ND1. A source of the first transistor T11 may be coupled to the ground voltage. A gate of the second transistor T12 may be coupled to a second node ND2. A source of the second transistor T12 may receive the first power supply voltage VPP. A drain of the second transistor T12 may be coupled to the first node ND1. The enable control signal PEN may be generated from the second node ND2. A gate of the third transistor T13 may be coupled to the first node ND1. A source of the third transistor T13 may receive the first power supply voltage VPP. A drain of the third transistor T13 may be coupled to the gate of the second transistor T12 and the second node ND2. A gate of the fourth transistor T14 may receive the word line off signal WLOFF. A drain of the fourth transistor T14 may be coupled to the second node ND2. A source of the fourth transistor T14 may receive the ground voltage. A gate of the fifth transistor T15 may receive the word line off signal WLOFF. A source of the fifth transistor T15 may receive the second power supply voltage VDD. A drain of the fifth transistor T15 may be coupled to the source of the first transistor T11. When the first pre-decoding signal PXDEC<0> is asserted, the first transistor T11 may couple the first node ND1 to the ground voltage, and the third transistor T13 may enable the enable control signal PEN by driving the second node ND2 to the voltage level of the first power supply voltage VPP. When the enable control signal PEN is enabled, the second transistor T12 may be turned off, and the voltage level of the first node ND1 may be maintained to a logic low level. When the word line off signal WLOFF is enabled, the fourth transistor T14 may disable the enable control signal PEN by coupling the second node ND2 to the ground voltage. Furthermore, the fifth transistor T15 may provide the second power supply voltage VDD to the first node ND1 by providing the first power supply voltage VPP to the source of the first transistor T11. When the second power supply voltage VDD is provided to the first node ND1, the third transistor T13 may be turned off. When the enable control signal PEN is disabled, the second transistor T12 may be turned on, and the second transistor T12 may maintain the voltage level of the first node ND1 to a logic high level by providing the first power supply voltage VPP to the first node ND1.

The enable control signal generation circuit 410 may further include a sixth transistor T16. The sixth transistor T16 may be an N channel MOS transistor. A gate of the sixth transistor T16 may receive a row enable signal XDECEN. A drain of the sixth transistor T16 may be coupled to the sources of the first and fifth transistors T11 and T15 in common. A source of the sixth transistor T16 may be coupled to the ground voltage. The row enable signal XDECEN may be enabled during an active operation of the memory apparatus 100 illustrated in FIG. 1, and may be enabled when the row decoder 140 generates the pre-decoding signal PXDEC from the row address signal RADD. When the row enable signal XDECEN is enabled, the sixth transistor T16 may provide the ground voltage to the sources of the first and fifth transistors T11 and T15.

The first driver 420 may include a first transistor T21, a second transistor T22, a third transistor T23, and a fourth transistor T24. The first transistor T21 may be a P channel MOS transistor. The second to fourth transistors T22, T23, and T24 may each be an N channel MOS transistor. A gate of the first transistor T21 may receive the enable control signal PEN. A source of the first transistor T21 may receive the first power supply voltage VPP. A drain of the first transistor T21 may be coupled to a first output node ON1. The first main word line signal MWL<0> may be output through the first output node ON1. A gate of the second transistor T22 may receive the enable control signal PEN. A drain of the second transistor T22 may be coupled to the first output node ON1. A gate of the third transistor T23 may receive the even selection signal SWEV. A drain of the third transistor T23 may be coupled to a source of the second transistor T22. A source of the third transistor T23 may be coupled to the ground voltage. A gate of the fourth transistor T24 may be coupled to the first output node ON1. A drain of the fourth transistor T24 may be coupled to the second node ND2. A source of the fourth transistor T24 may be coupled to the ground voltage. When the enable control signal PEN and the even selection signal SWEV are enabled to a logic high level, the second and third transistors T22 and T23 may be turned on, and the first main word line signal MWL<0> may be enabled to a logic low level because the ground voltage is provided to the first output node ON1 through the second and third transistors T22 and T23. When any one of the enable control signal PEN and the even selection signal SWEV is in a disable state, the first main word line signal MWL<0> may maintain the disable state. When the enable control signal PEN is disabled to a logic low level, the first transistor T21 may be turned on, and the first transistor T21 may disable the first main word line signal MWL<0> to a logic high level by providing the first power supply voltage VPP to the first output node ON1. The fourth transistor T24 may maintain the level of the enable control signal PEN to a logic low level when the first main word line signal MWL<0> is in the disable state, and may be turned off when the first main word line signal MWL<0> is in the enable state.

The second driver 430 may include a first transistor T31, a second transistor T32, a third transistor T33, and a fourth transistor T34. The first transistor T31 may be a P channel MOS transistor. The second to fourth transistors T32 and T33, and T34 may each be an N channel MOS transistor. A gate of the first transistor T31 may receive the enable control signal PEN. A source of the first transistor T31 may receive the first power supply voltage VPP. A drain of the first transistor T31 may be coupled to the second output node ON2. The second main word line signal MWL<1> may be output through a second output node ON2. A gate of the second transistor T32 may receive the enable control signal PEN. A drain of the second transistor T32 may be coupled to the second output node ON2. A gate of the third transistor T33 may receive the odd selection signal SWOD. A drain of the third transistor T33 may be coupled to a source of the second transistor T32. A source of the third transistor T33 may be coupled to the ground voltage. A gate of the fourth transistor T34 may be coupled to the second output node ON2. A drain of the fourth transistor T34 may be coupled to the second node ND2. A source of the fourth transistor T34 may be coupled to the ground voltage. When the enable control signal PEN and the odd selection signal SWOD are enabled to a logic high level, the second and third transistors T32 and T33 may be turned on, and the second main word line signal MWL<1> may be enabled to a logic low level because the ground voltage is provided to the second output node ON2 through the second and third transistors T32 and T33. When any one of the enable control signal PEN and the odd selection signal SWOD is in a disable state, the second main word line signal MWL<1> may maintain the disable state. When the enable control signal PEN is disabled to a logic low level, the first transistor T31 may be turned on, and the first transistor T31 may disable the second main word line signal MWL<1> to a logic high level by providing the first power supply voltage VPP to the second output node ON2. The fourth transistor T34 may maintain the level of the enable control signal PEN to a logic low level when the second main word line signal MWL<1> is in the disable state, and may be turned off when the second main word line signal MWL<1> is in the enable state.

The main word line driver 400 may selectively enable one of the first and second main word line signals MWL<0> and MWL<1> by using the even selection signal SWEV and the odd selection signal SWOD. When each of the first and second main word line signals MWL<0> and MWL<1> is connected to n sub-word line drivers, the main word line driver 400 may have a load corresponding to a total of 2n sub-word line drivers. However, the load of the main word line driver 400 can be reduced to a load corresponding to the n sub-word line drivers because the main word line driver 400 selectively enables one of the first and second main word line signals MWL<0> and MWL<1>. Furthermore, the main word line driver 400 can have a reduced circuit area because the main word line driver 400 can consist of a small number of transistors, and can increase driving power of a main word line signal by increasing the size (i.e., the ratio of the width to the length) of a transistor that drives the main word line signal by the reduced circuit area.

Figure 5:
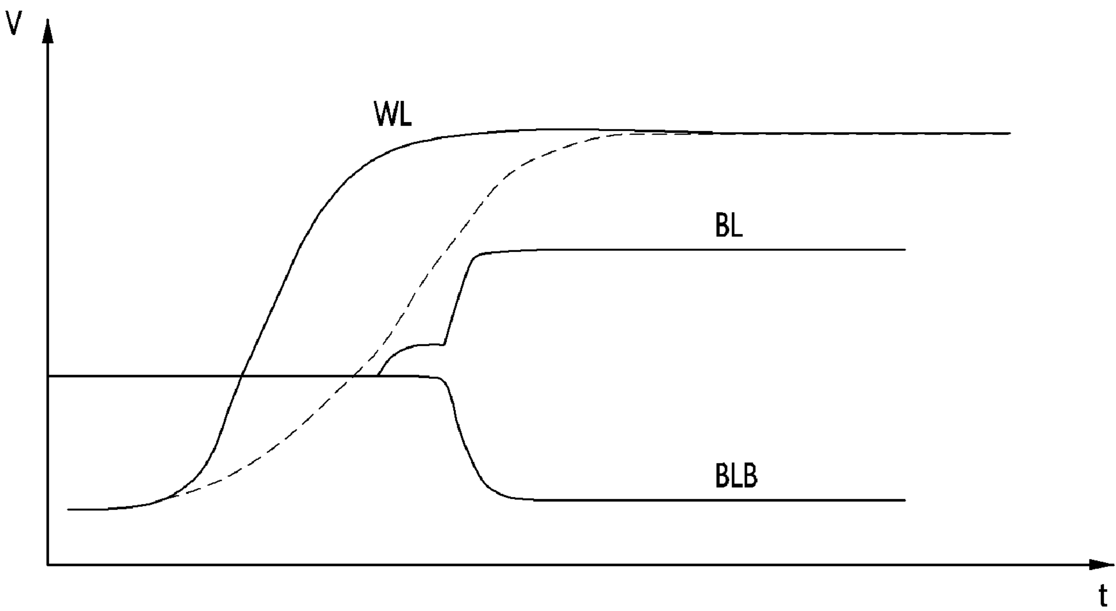
FIG. 5 is a timing diagram illustrating an operation of a memory apparatus according to an embodiment.

FIG. 5 is a timing diagram illustrating an operation of a memory apparatus according to an embodiment. In FIG. 5, the transverse axis indicates time "t", and the longitudinal axis indicates voltage V. Referring to FIGS. 1, 3, and 5, the memory apparatus 100 may receive the command signal CMD and the address signal ADD for enabling an active operation to be performed. The address latch circuit 130 may generate the row address signal RADD from the address signal ADD and provide the row address signal RADD to the row decoder 140. The row decoder 140 may generate the pre-decoding signal PXDEC and the selection decoding signal FXDEC by decoding the row address signal RADD. The main word line drivers MWD1 and MWD2 of the main word line driver block MWD may each enable one of two main word line signals MWL based on some bits of the pre-decoding signal PXDEC and the selection decoding signal FXDEC. A sub-word line driver that receives the enabled main word line signal and that is selected based on each of the sub-word line driver selection signals FX<0:n−1> and FX<n:2n−1>, among the sub-word line drivers of each of the sub-word line driver blocks SWDA and SWDB, may enable a word line WLx of a memory cell array that is coupled to the sub-word line driver. When the word line WLx is enabled, charge sharing may occur between a bit line BLx and a bit line bar BLBx. The bit line sense amplifier of the sense amplification block BLSA may raise the voltage level of the bit line BLx by amplifying a difference between the voltage levels of the bit line BLx and the bit line bar BLBx, and may drop the voltage level of the bit line bar BLBx. Timing at which the word line WLx is enabled may be advanced compared to a conventional technology (indicated by a dotted line) because driving power of the main word line driver MWD1 and MWD2 has been improved. If the word line WLx is enabled rapidly, operation reliability of the memory apparatus 100 can be improved because a timing margin in which charge sharing between the bit line BLx and the bit line bar BLBx occurs can be sufficiently secured.

As described above, those skilled in the art to which the present technology pertains will understand that the present technology may be implemented in various other forms without departing from the technical spirit or essential characteristics of the present technology. Accordingly, it is to be understood that the aforementioned embodiments are illustrative from all aspects not being limitative. The scope of the present technology is defined by the appended claims rather than by the detailed description, and all modifications or variations derived from the meanings and scope of the claims and equivalents thereof should be understood as being included in the scope of the present technology.

What is claimed is:

1. A main word line driver comprising:

an enable control signal generation circuit configured to generate an enable control signal based on a pre-decoding signal;

a first driver configured to enable a first main word line signal based on the enable control signal and an even selection signal; and a second driver configured to enable a second main word line signal based on the enable control signal and an odd selection signal, wherein the first transistor receives the enable control signal to apply a first power supply voltage to a first output node, and the first main word line signal is output from the first output node, the second transistor receives the enable control signal, the third transistor receives the even selection signal, the second transistor and the third transistor are coupled in series between the first output node and a ground voltage, and the fourth transistor receives the first main word line signal to couple the enable control signal and the ground voltage.

2. The main word line driver according to claim 1, wherein the enable control signal generation circuit is configured to:

drive a first node to a voltage level of a ground voltage when the pre-decoding signal is asserted, and drive the enable control signal to a voltage level of the first power supply voltage based on a voltage level of the first node.

3. The main word line driver according to claim 2, wherein the enable control signal generation circuit is configured to drive the enable control signal to the voltage level of the ground voltage based on a word line off signal.

4. The main word line driver according to claim 3, wherein:

the enable control signal generation circuit is configured to provide a second power supply voltage to the first node based on the word line off signal, and the second power supply voltage has a higher voltage level than the ground voltage and has a lower voltage level than the first power supply voltage.

5. The main word line driver according to claim 1, wherein the first driver is configured to enable the first main word line signal and maintain a state in which the first main word line signal has been enabled when the enable control signal and the even selection signal are enabled.

6. The main word line driver according to claim 5, wherein the second driver is configured to enable the second main word line signal and maintain a state in which the second main word line signal has been enabled when the enable control signal and the odd selection signal are enabled.

7. The main word line driver according to claim 1, wherein a gate of the first transistor receives the enable control signal, a source of the first transistor receives the first power supply voltage, a drain of the first transistor is coupled to the first output node;

a gate of the second transistor receives the enable control signal, and a drain of the second transistor is coupled to the first output node;

a gate of the third transistor receives the even selection signal, a drain of the third transistor is coupled to a source of the second transistor, and a source of the third transistor is coupled to the ground voltage; and a gate of the fourth transistor is coupled to the first output node, a drain of the fourth transistor is coupled to the enable control signal, and a source of the fourth transistor is coupled to the ground voltage.

8. The main word line driver according to claim 1, wherein:

the second driver comprises a first transistor, a second transistor, a third transistor, and a fourth transistor, a gate of the first transistor receives the enable control signal, a source of the first transistor receives the first power supply voltage, a drain of the first transistor is coupled to a second output node, and the second main word line signal is output from the second output node, a gate of the second transistor receives the enable control signal, and a drain of the second transistor is coupled to the second output node, a gate of the third transistor receives the odd selection signal, a drain of the third transistor is coupled to a source of the second transistor, and a source of the third transistor is coupled to the ground voltage, and a gate of the fourth transistor is coupled to the second output node, a drain of the fourth transistor is coupled to the enable control signal, and a source of the fourth transistor is coupled to the ground voltage.

9. A memory apparatus comprising:

a plurality of sequentially stacked memory cell arrays each comprising a plurality of word lines;

a sub-word line driver block configured to enable at least one word line among the plurality of word lines of each of the plurality of memory cell arrays based on a first main word line signal, a second main word line signal, and a sub-word line selection signal; and a main word line driver block configured to enable the first and second main word line signals based on a pre-decoding signal and an even and odd selection signal, wherein the sub-word line driver block comprises a first sub-word line driver block configured to enable first word lines of the plurality of memory cell arrays and a second sub-word line driver block configured to enable second word lines of the plurality of memory cell arrays, and wherein each of the first and second sub-word line driver blocks comprises a number of sub-word line drivers equal to a number of pluralities of memory cell arrays that have been stacked.

10. The memory apparatus according to claim 9, wherein:

the first sub-word line driver block enables one of the first word lines of the plurality of memory cell arrays based on the sub-word line selection signal when the first main word line signal is enabled, and the second sub-word line driver block enables one of the second word lines of the plurality of memory cell arrays based on the sub-word line selection signal when the second main word line signal is enabled.

11. The memory apparatus according to claim 9, wherein the main word line driver block comprises a main word line driver configured to enable one of the first and second main word line signals based on the pre-decoding signal and the even and odd selection signal.

12. The memory apparatus according to claim 11, wherein the main word line driver is configured to:

enable an enable control signal when the pre-decoding signal is asserted, enable the first main word line signal when the even and odd selection signal has a first logic level, and enable the second main word line signal when the even and odd selection signal has a second logic level.

13. The memory apparatus according to claim 9, wherein the main word line driver block is disposed on a plane different from a plane on which the plurality of memory cell arrays is disposed.

14. The memory apparatus according to claim 9, wherein the main word line driver block is disposed under the plurality of memory cell arrays.

15. A main word line driver comprising:

an enable control signal generation circuit configured to drive a first node to a ground voltage when a pre-decoding signal is asserted and to drive an enable control signal to a voltage level of a first power supply voltage based on a voltage level of the first node;

a first driver configured to enable a first main word line signal based on the enable control signal and an even selection signal; and a second driver configured to enable a second main word line signal based on the enable control signal and an odd selection signal, wherein the enable control signal generation circuit is configured to drive the enable control signal to the ground voltage based on a word line off signal, and to provide a second power supply voltage to the first node based on the word line off signal.

16. The main word line driver according to claim 15, wherein the second power supply voltage has a higher voltage level than the ground voltage and has a lower voltage level than the first power supply voltage.

* * * * *